(12) United States Patent
Hayashi et al.

(10) Patent No.: US 7,819,179 B2
(45) Date of Patent: Oct. 26, 2010

(54) TEMPERATURE CONTROL APPARATUS

(75) Inventors: Shintaro Hayashi, Yokohama (JP); Osamu Urakawa, Yokohama (JP); Mitsuo Koizumi, Fukushima (JP)

(73) Assignee: Daytona Control Co., Ltd., Kanagawa (JP)

( * ) Notice: Subject to any disclaimer, the term of this patent is extended or adjusted under 35 U.S.C. 154(b) by 924 days.

(21) Appl. No.: 11/705,452

(22) Filed: Feb. 13, 2007

(65) Prior Publication Data

US 2007/0240872 A1 Oct. 18, 2007

Related U.S. Application Data

(63) Continuation-in-part of application No. 11/405,423, filed on Apr. 18, 2006.

(51) Int. Cl.
*F25B 29/00* (2006.01)

(52) U.S. Cl. ............ 165/263; 165/264; 165/80.4; 165/80.5; 165/260; 165/48.1; 165/63; 165/64; 324/760; 62/196.4; 62/197

(58) Field of Classification Search ......... 165/263, 165/264, 80.4, 80.5, 260, 48.1, 63, 64; 62/196.4, 62/197; 324/760
See application file for complete search history.

(56) References Cited

U.S. PATENT DOCUMENTS 3,734,810 A * 5/1973 Davis .................. 165/240
3,933,004 A * 1/1976 Carter et al. .............. 62/199
4,802,338 A * 2/1989 Oswalt et al. ............... 62/98
5,582,235 A * 12/1996 Hamilton et al. ......... 165/263
6,615,598 B1 * 9/2003 Wang et al. ................ 62/197
6,668,570 B2 12/2003 Wall et al.
6,736,206 B2 * 5/2004 Hisai ...................... 165/263
6,802,368 B2 * 10/2004 Getchel et al. ........... 165/263
7,100,389 B1 9/2006 Wayburn et al.
7,199,597 B2 4/2007 Tustaniwskyj et al.
2005/0183432 A1 8/2005 Cowans et al.

FOREIGN PATENT DOCUMENTS

| JP | 09189468 A | * | 7/1997 |
| WO | 02/097342 | | 12/2002 |
| WO | 2005/081003 | | 9/2005 |

* cited by examiner

*Primary Examiner*—John K Ford
(74) *Attorney, Agent, or Firm*—Nixon & Vanderhye, PC

(57) ABSTRACT

A temperature control apparatus including a temperature control head kept in contact with an electronic device as a testing object thermally, an electric heater attached to the temperature control head, a refrigerant passage formed within the temperature control head so as to run through inside thereof, a compressor which compresses refrigerant coming out of the temperature control head, a temperature sensor which detects a temperature of refrigerant on an outlet side of the compressor, a condenser which condenses refrigerant coming out of the compressor, a returning portion which returns refrigerant condensed by the condenser to the temperature control head, and a control portion which bypasses the condensed refrigerant to the intake side of the compressor by a predetermined quantity corresponding to an output of the temperature sensor.

6 Claims, 3 Drawing Sheets

TEMPERATURE CONTROL APPARATUS

CROSS-REFERENCE TO RELATED APPLICATIONS

This is a Continuation-in-Part application of U.S. patent application Ser. No. 11/405,423, filed Apr. 18, 2006, the entire contents of which are incorporated herein by reference.

BACKGROUND OF THE INVENTION

1. Field of the Invention

The present invention relates to a temperature control apparatus, and particularly to a temperature control apparatus for controlling the temperature of an electronic device at the time of test.

2. Description of the Related Art

Prior to shipment, performance test of an electronic device, for example, a semiconductor chip needs to be carried out at a room temperature or a higher temperature or a lower temperature. When the performance test of a semiconductor chip is carried out at a room temperature under a rated current, heat is generated inside the semiconductor chip by this current so that the temperature of the chip is raised more than the room temperature. Thus, the semiconductor chip needs to be cooled appropriately to maintain the temperature at the room temperature. When the semiconductor chip is heated with a heater or the like in case of high temperature test, it needs to be cooled appropriately in order to prevent the temperature from being raised more than a setting temperature. These cases of cooling are carried out with a temperature setting head loaded with a semiconductor chip connected to a predetermined cooling system.

As a conventional temperature control apparatus, a temperature control apparatus disclosed in, for example, U.S. Pat. No. 6,668,570 has been known. This conventional apparatus, as shown in FIG. 1 of this patent document, executes temperature control of an electronic device 10 by a thermal head 14 which combines a passage 36 in which refrigerant flows with an electric heater 30 in contact with the electronic device 10. In a cooling system using the thermal head 14 having such a structure, heat is generated from the electronic device 10 and the heater 30 and this heat is absorbed by the cooling system. Therefore, when the amount of heat generated from the thermal head increases at the time of high temperature test, for example, the quantity of heat absorbed by refrigerant in the thermal head 14 increases so that the temperature of refrigerant supplied to a compressor 32 rises. As a result, the temperature in the compressor 32 is raised by heat generated therein when refrigerant is compressed and if this temperature exceeds a setting maximum temperature of the compressor 32, a large thermal stress is applied to components inside the compressor 32, so that the compressor 32 may be possibly damaged. Therefore, the quantity of heat generated from the heater 14 needs to be controlled strictly in order to prevent this serious phenomenon. This leads to increase in cost of the entire temperature control apparatus and a temperature controllable range between the lower limit and upper limit of the temperature control narrows, thereby limiting an electronic device which can be tested to particular ones.

BRIEF SUMMARY OF THE INVENTION

According to one aspect of the present invention, there is provided a temperature control apparatus comprising: a temperature control head kept in contact with an electronic device as a testing object thermally; an electric heater attached to the temperature control head; a refrigerant passage formed within the temperature control head so as to run through inside thereof; a compressor which compresses refrigerant coming out of the temperature control head; a temperature sensor which detects a temperature of the compressor; a condenser which condenses refrigerant coming out of the compressor; a returning portion which returns refrigerant condensed by the condenser to the temperature control head; and a control portion which bypasses the refrigerant condensed by the condenser to an intake side of the compressor by a predetermined quantity corresponding to an output of the temperature sensor.

According to another aspect of the present invention, there is provided a temperature control apparatus comprising: a temperature control head kept in contact with an electronic device as a testing object thermally; an electric heater attached to the temperature control head; a refrigerant passage formed within the temperature control head so as to run through inside thereof; a first temperature sensor which detects a temperature of the electronic device; a compressor which compresses refrigerant coming out of the temperature control head; a second temperature sensor which detects a temperature of the compressor; a condenser which condenses refrigerant coming out of the compressor; a returning portion which returns refrigerant condensed by the condenser to the temperature control head; and a control portion which controls the temperature of the electronic device by controlling the quantity of electricity supplied to the electric heater and the quantity of refrigerant flowing through the refrigerant passage corresponding to an output of the first temperature sensor and controls the quantity of the condensed refrigerant bypassed to the intake side of the compressor corresponding to an output of the second temperature sensor.

According to further aspect of the present invention, there is provided with a temperature control apparatus comprising: a temperature control head kept in contact with an electronic device as a testing object thermally; an electric heater attached to the temperature control head; a refrigerant passage formed within the temperature control head so as to run through refrigerant inside thereof; a first temperature sensor which detects a temperature of the electronic device; a compressor which compresses refrigerant coming out of the temperature control head; a second temperature sensor which detects a temperature of refrigerant on the outlet side of the compressor; a condenser which condenses refrigerant coming out of the compressor; a returning portion which returns refrigerant condensed by the condenser to the temperature control head; a bypass portion including first and second bypass passages connected in parallel to each other for returning the refrigerant condensed by the condenser to the compressor by bypassing the temperature control head; a first control portion which controls the temperature of the electronic device by controlling the quantity of electricity of the electric heater, the quantity of refrigerant flowing through the first bypass passage and the quantity of refrigerant flowing through the refrigerant passage in the temperature control head corresponding to an output of the first temperature sensor; and a second control portion which controls a temperature of the refrigerant on the intake side of the compressor by controlling the quantity of refrigerant flowing through the second bypass passage corresponding to the output of the second temperature sensor.

DETAILED DESCRIPTION OF THE INVENTION

Hereinafter, an embodiment of the present invention will be described in detail with reference to the accompanying drawings.

Figure 1:
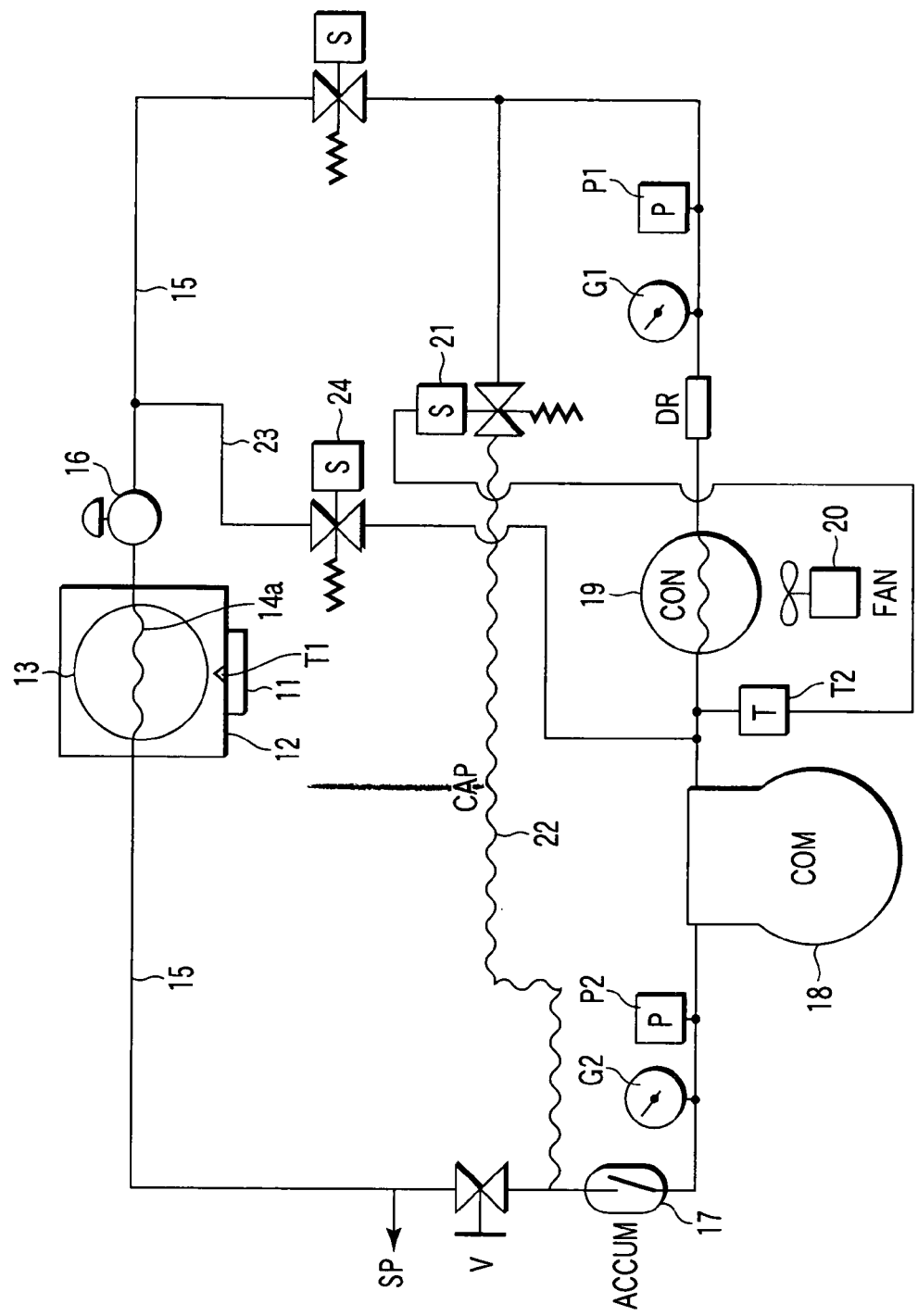
FIG. 1 is a diagram schematically showing a structure of a cooling circuit of a temperature control apparatus of an electronic device including a compressor protection section according to an embodiment of the present invention.

Referring to FIG. 1, an evaporator 13 is provided within a temperature control head 12 with which an electronic device 11 as a testing object such as a semiconductor chip is kept in contact thermally. An electric heater described later is attached to this head 12 and a refrigerant passage 14a in which refrigerant flows through is formed within the evaporator 13. The evaporator 13 is connected to a cooling circuit including a pipe 15 serving as a passage of refrigerant. An expansion valve 16 is connected to a refrigerant intake side of the evaporator 13 and an outlet side thereof is connected to a compressor 18 through an accumulator 17. The pressure of refrigerant on the intake side of the expansion valve 16 is high while the pressure of refrigerant in the downstream of the evaporator 13 on the outlet is low.

After passing the temperature control head 12, low pressure gaseous refrigerant is collected in the accumulator 17 and then fed to and compressed in the compressor 18. High pressure gaseous refrigerant compressed by this compressor 18 is condensed by a condenser 19 on a next step using a fan 20 to form mist-like refrigerant. The mist-like refrigerant formed in the condenser 19 is a mixture of gaseous refrigerant and condensed refrigerant particles or small liquid particles of refrigerant. The condensed mist-like refrigerant is returned to the expansion valve 16 through the pipe 15 and further returned to the accumulator 17 through a bypass including an electromagnetic valve 21 and a capillary tube 22. Further, the outlet side of the compressor 18 and intake side of the expansion valve 16 are connected by a bypass line 23 via an electromagnetic valve 24, so that the gaseous refrigerant of high-temperature and high-pressure is mixed with the mist-like refrigerant flowing through the pipe 15 at the inlet side of the expansion valve 16.

The cooling system having such a structure includes a first temperature sensor T1 for detecting the temperature of the electronic device 11 in the temperature control head 12 and a second temperature sensor T2 for detecting the temperature of the compressor 18. In the case of FIG. 1, the sensor T2 is set at the outlet side of the compressor for measuring the temperature of the refrigerant on the outlet side of the compressor 18. The sensor T2 may be provided at the inlet side of the compressor 18 for measuring the temperature of the refrigerant supplied to the compressor 18 or may be provided at the inside of the compressor 18 as the temperature of the compressor 18. It further includes a system controller being described later (not shown in FIG. 1) which executes, for example, PID control as a control portion for controlling the temperature of the electronic device 11 by controlling the quantity of current supplied to the electric heater and the quantity of refrigerant flowing through the refrigerant passage 14a corresponding to an output of the first temperature sensor T1 and controlling the quantity of the condensed refrigerant bypassing to the intake side of the compressor 18 through the capillary tube 22 corresponding to an output of the second temperature sensor T2. The amount of bypassed refrigerant through the bypass line 23 from the outlet side of the compressor 18 to the inlet side of the expansion valve 16 is controlled to by constant by opening the electromagnetic valve 24 at a fixed opening position determined in accordance with a specification of the electronic device 11 to be tested. The detailed explanation of the valve control will be described later.

The cooling system shown in FIG. 1 may be provided with a drier DR, a high-pressure gauge G1, a high-pressure pressure switch P1, an electromagnetic valve S, a service port SP, a ball valve V, a low pressure gauge G2, a low-pressure pressure switch P2 and the like corresponding to each purpose.

Hereinafter, the concrete structure of the cooling system shown in FIG. 1 will be described with reference to FIG. 2.

The same reference numerals are attached to components corresponding to those of FIG. 1. The temperature control head 12 is constructed by combining the evaporator 13 having plural refrigerant passages 14a and an electric heater 14b. An electronic device or a semiconductor chip 11 is pressed to the bottom face of the temperature control head 12 through a high-heat conductive member 12a. A plurality of solder ball terminals 11a are formed on the bottom face of the semiconductor chip 11 and the semiconductor chip 11 is connected to a connecting terminal provided on a socket 10s through this solder ball terminal 11a and further connected to an outside test unit (not shown) so as to perform a predetermined test. A probe T1P of the temperature sensor T1 is kept in contact with the semiconductor chip 11 and a detection output of the temperature sensor T1 is supplied to a system controller 31 for PID control. The electric heater 14b provided on the temperature control head 12 is driven by a heater driver 14bD under a control of the system controller 31. A computer such as a micro-processor may be used as the system controller 31 in place of the PID controller.

The plurality of refrigerant passages 14a formed within the evaporator 13 are connected to the refrigerant pipe 15 on the intake side and the refrigerant pipe 15 on the outlet side. The refrigerant pipe 15 connected to the outlet side of the temperature control head 12 is connected to the compressor 18 through the accumulator 17. A probe T2P of another temperature sensor T2 is installed on the refrigerant pipe 15 on the outlet side of this compressor 18 in the present embodiment so as to detect the temperature of refrigerant on the outlet side of the compressor 18. As above-mentioned, the probe T2P of the sensor T2 may be provided at another place such as on the inlet side of inside of the compressor 18. A detection output of this temperature sensor T2 is supplied to the system controller 31.

The refrigerant pipe 15 connected to the outlet side of the compressor 18 is coupled with the intake side of the condenser 19. This condenser 19 is a heat radiator and heat of refrigerant is radiated by blowing air to the radiator 19 with the fan 20 to condense gaseous refrigerant to mist-like refrigerant. The refrigerant pipe 15 connected to the outlet side of the condenser 19 is branched to a first branch pipe 15A and a second branch pipe 15B in succession. These first and second branch pipes 15A, 15B communicate with the refrigerant pipe 15 connected to the intake side of the accumulator 17 through electromagnetic valves 15AV, 15BV, respectively. These electromagnetic valves 15AV, 15BV are opened/closed by the system controller 31 under each predetermined condition, which will be described later.

The refrigerant pipe 15 connected to the outlet side of the condenser 19 is connected to the intake side of the electronic expansion valve 16 provided on the intake side of evaporator 13.

Figure 2:
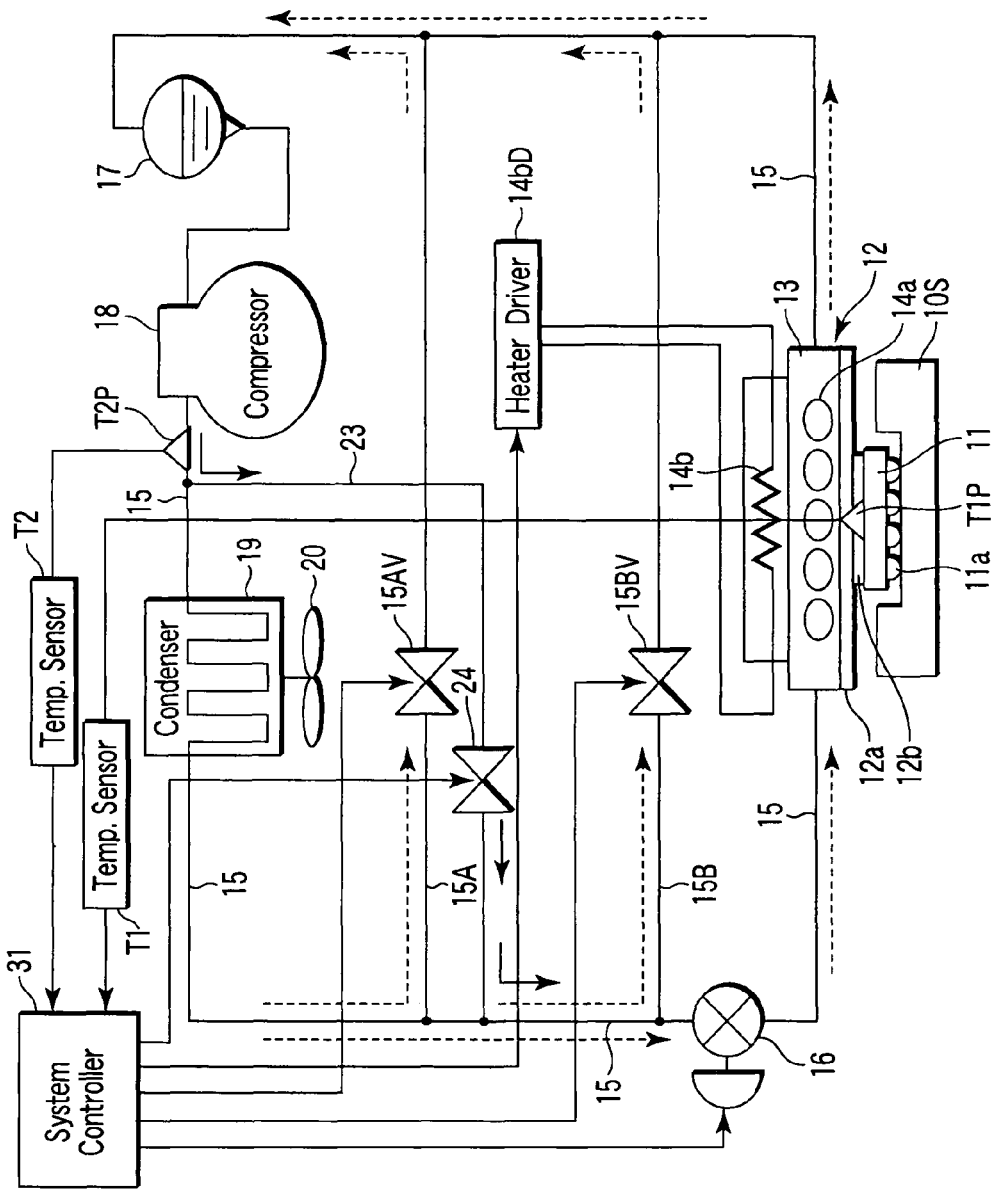
FIG. 2 is a structure diagram showing a concrete structure of the embodiment shown in FIG. 1.

Further, in the embodiment shown in FIGS. 1 and 2, a bypass line 23 is provided from the outlet side of the compressor 18 to the inlet side of the expansion valve 16 for bypassing the condenser 19. An electromagnetic valve 24 is provided on the bypass line 23. The bypass line 23 is connected between the refrigerant pipe 15 at the outlet side of the compressor 18 to another refrigerant pipe 15 connected from the outlet side of the condenser 19 to the inlet side of the expansion valve 16 via the electromagnetic valve 24, thereby bypassing the condenser 19. In the case of FIG. 2, the outlet side of the electromagnetic valve 24 is connected at a point on the pipe 15 provided between the two bypassing points of the bypass lines 15A and 15B. Further, the outlet side of the electromagnetic valve 24 may be connected preferably at a position on the pipe line 15 between the bypassing point of the bypass line 15B and the expansion valve 16. The electromagnetic valve 24 is set at a predetermined open position according to a control signal from the system controller 31.

Figure 3:
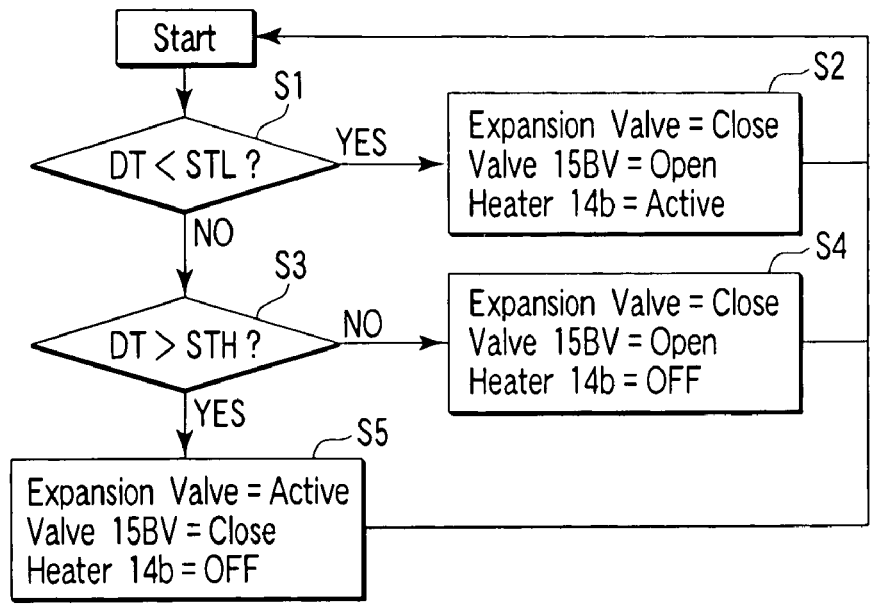
FIG. 3 is a flow chart for explaining the temperature control operation of this embodiment.
Figure 4:
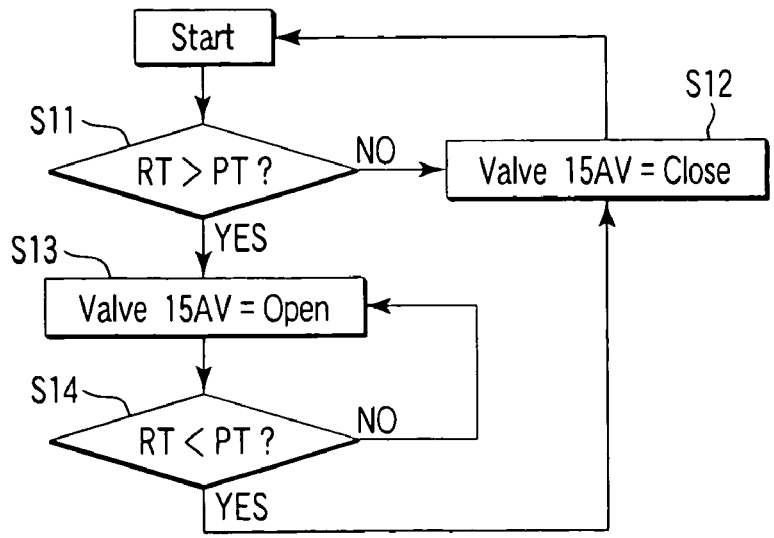
FIG. 4 is a flow chart for explaining the protective operation of the cooling circuit according to this embodiment.

Next, the operation of the cooling system having such a structure shown in FIG. 2 will be described with reference to FIGS. 3 and 4. If the performance test of the electronic device 11 is carried out at a predetermined temperature higher than the room temperature, a user sets up a lower limit value STL of a setting temperature range in the system controller 31. In this case, a temperature DT of the temperature control head 12 is equal to the room temperature and a temperature detected by the temperature sensor T1 through the probe T1P is low when the temperature control is started. Thus, a result of determination turns to YES in initial step S1 of FIG. 3 (DT<STL?) and the control proceeds to step S2. As a consequence, an instruction of "CLOSE" is sent from the system controller 31 to the expansion valve 16 so that no refrigerant flows to the evaporator 13 and the valve 15BV turns to "OPEN" to allow refrigerant to pass through the bypass passage 15B. At the same time, the heater driver 14bB is driven to supply electricity to the electric heater 14b, so that the temperature control head 12 is heated up to the test temperature.

At this time, the electromagnetic valve 24 is set at an open state with a predetermined open degree and the gaseous refrigerant of high-temperature and high-pressure from the compressor 18 is supplied to the inlet side of the expansion valve 16. However, since the expansion valve 16 is set at the closed state, this refrigerant bypassed the condenser 19 is not supplied to the expansion valve 16 but is returned through the bypass line 15B. At this time, the electronic device 11 being tested is not positioned in the temperature control head 12. The device 11 is held at the high testing temperature at a waiting position (not shown). The open degree of the electromagnetic valve 24 is set at a predetermined value when the device test is started so that the temperature of the temperature control head 12 is held within a predetermined range in response to the heat generated during the electronic device 11 is tested and the ambient temperature of the head 12.

When the temperature DT of the temperature control head 12 exceeds the lower setting temperature STL, a result of determination in step S1 becomes at NO, the electronic device 11 being tested is put in the temperature control head 12, and the performance test of the device 11 is executed. During the test, a predetermined test current flows through the device 11 and heat will be generated from the device 11, and the control proceeds to step S3. Here, whether or not the temperature DT of the head 12 or the electronic device 11 detected by the temperature sensor T1 exceeds the upper limit value STH of the test temperature range (DT>STH?) is determined. If the result is NO, the control proceeds to step S4, in which an instruction of "CLOSE" continues to be given to the electromagnetic expansion valve 16 from the system controller 31 and a condition in which refrigerant is blocked from flowing to the evaporator 13 is maintained and the valve 15BV turns to "OPEN" so that refrigerant continues to pass through the bypass passage 15B. At the same time, the heater driver 14bD is stopped to drive the electric heater 14b which is turned to non-driven state, thereby stopping heating of the electronic device 11. On the other hand, a test current is continued to be supplied to the electronic device 11 and predetermined amount of heat is generated according to the test current.

On the other hand, if the temperature of the electronic device 11 rises too much in the condition of step S3 (DT>STH? is YES), the control proceeds to step S5, in which an instruction "OPEN" is supplied from the system controller 31 to the electromagnetic expansion valve 16 and the mist-like refrigerant begins to flow into the evaporator 13. At the same time, the valve 15BV turns to "CLOSE" so that refrigerant is blocked from passing the bypass passage 15B. At this time, the drive condition of the heat driver 14bD is released so that no current is supplied to the electric heater 14b and the heating of the electronic device 11 by the heater 14b is stopped, except for the heating by the interior heat generated from the electronic device 11. As a result, the electronic device 11 is cooled by absorption of heat when the mist-like refrigerant flowing through the evaporator 13 is evaporated and the temperature DT falls to the lower setting temperature STL. In this condition, since the electromagnetic valve 24 is set to an open state with a predetermined open degree, the gaseous refrigerant of high-temperature and high-pressure is supplied directly to the inlet side of the expansion valve from the outlet side of the compressor 18 so that the gaseous refrigerant is mixed with the mist-like refrigerant in the pipe 15. As a result, the temperature of the mist-like refrigerant supplied to the temperature control head 12 from the expansion valve 16 is high compared with a case in which no gaseous refrigerant is supplied from the pipe 23 via the electromagnetic valve 24. Therefore, when a high-temperature test of 100° C., for example, is being executed, it is possible to maintain the test temperature of 100° C. by supplying the high temperature gaseous refrigerant from the valve 24.

When DT<STL is obtained, the control is YES in step S1 so that the same temperature control action is maintained between the lower and upper temperature setting ranges STL and STH.

As for the control of the electric heater 14b and the expansion valve 16, software control by a computer can be executed instead of hardware control by the system controller 31 by PID.

When the performance test of the electronic device 11 is executed at a high temperature higher than the room temperature in the embodiment of FIG. 2, the user sets the system controller 31 so that the heater 14b is driven by the heater driver 14bD to generate heat. In the same time, the temperature of the temperature control head 12 is set to be high so that the electronic device 11 being tested is heated at a test temperature, when the test is started. In the embodiment, the electromagnetic valve 24 is set to be open when the high-temperature test is started. In this condition, the electromagnetic valves 15AV, 15BV are closed and the expansion valve 16 is set to be open.

When the device performance test is started, the test current is supplied to the electronic device 11, and the high temperature gaseous refrigerant delivered at the outlet side of the compressor 18 is supplied to the pipe 15 at the inlet side of the expansion valve 16 via the electromagnetic valve 24 in the bypass line 23. Low temperature mist-like refrigerant flowing in the pipe 15 from the condenser 19 is mixed with the high temperature gaseous refrigerant flowing into the pipe 15 from the pipe 23 and the mixed refrigerant is supplied to the expansion valve 16. Thus, after the test is started, the temperature of the refrigerant at the inlet side of the expansion valve 16 raises rapidly in the case of the embodiment shown in FIG. 2. The pressure of the refrigerant is lowered at the outlet side of the expansion valve 16 and the low pressure mist-like refrigerant is supplied to the evaporator 13 of the temperature control head 12. The mist-like refrigerant is evaporated in the evaporator 13 to regulate and maintain the temperature of the electronic device 11 at the test temperature. The temperature in the temperature control head 12 is mainly varied by the heat generated from the interior of the electronic device 11 during the performance test is executed. Therefore, the temperature in the head 12 is mainly controlled so as to maintain the temperature in the head 12 at the test temperature in response to the temperature change caused by the heat generated from the device 11 under test by appropriately absorbing this heat with the evaporated refrigerant.

Since the maximum rated current being supplied to the electronic device 11 during the performance test thereof is known, the maximum amount of heat generated from the device can be estimated. Further, even if the electromagnetic valve 24 is set at a constant open state, it is possible to maintain the temperature of the device 11 within a predetermined objective temperature range by the refrigerant supplied from the expansion valve 16 so that the refrigerant can absorb the fluctuation of the heat generated from the device 11, by controlling the heater driver 14$b$D to supply corresponding current to the electric heater 14$b$ by the system controller 31 during the test is executed, In the embodiment shown in FIG. 2, as above-mentioned, the bypass line 15A including the electromagnetic valve 15AV is important for protecting the compressor 18. Thus, the high-temperature test for the electronic device 11 can be performed with the electromagnetic valve 24 and the expansion valve 16 are set at the open state during the execution of the test, thereby enabling the temperature control of the device 11 under test very easily.

When the test is being performed at a low temperature, at 25° C. near the room temperature, for example, the electric heater 14$b$ is not driven and only the heat is generated from the device 11 during the test is performed. When the supply current to the device 11 during the test is small, it is not required to cool the device 11 since little heat is generated. When the supply current is large, much heat will be generated from the device 11 and the temperature of the device 11 may be varied beyond the set test temperature range of 25±3° C. When this is occurred, the electromagnetic valve 24 is closed so that the mist-like low temperature refrigerant from the condenser 19 is only supplied to the temperature control head 12 from the expansion valve 16. When the expansion valve 16 is set at the open state, a constant amount of refrigerant is supplied to the head 12. The refrigerant is the mist-like refrigerant which is a mixture of the gaseous refrigerant and fine particle liquid refrigerant. Therefore, when the high temperature gaseous refrigerant from the valve 24 is mixed with the low-temperature mist-like refrigerant, the component of the fine liquid particle refrigerant in the mixture of the refrigerant decreases and the cooling ability of the mixture refrigerant may be lowered in the temperature control head 12. On the contrary, when the electromagnetic valve 24 is closed in the low-temperature test, the cooling ability will be increased, since the component of the fine liquid particle increases. Therefore, even if the heat generated from the device 11 under test increases abruptly, it is possible to absorb the heat effectively in the temperature control head 12 so that the temperature of the device 11 may be maintained near the test temperature of 25° C.

Next, the operation of preventing the compressor 18 from being destroyed by overheat will be described with reference to FIG. 4. When the temperature control of the electronic device 11 is carried out with reference to FIG. 3, the refrigerant temperature RT in the pipe 15 on the outlet side of the compressor 18 is detected by the probe T2P of the temperature sensor T2 and sent to the system controller 31. A refrigerant upper limit temperature PT is set up on the system controller 31 in order to protect the compressor 18 and whether or not this refrigerant temperature RT is over the set refrigerant upper limit temperature PT is determined in step S11.

When the refrigerant temperature RT is lower than the refrigerant upper limit temperature PT, the result is NO and the control proceeds to step S12, in which the electromagnetic valve 15AV on the refrigerant bypass passage 15A is kept in "CLOSE". At this time, the electromagnetic valve 15BV on the other refrigerant bypass passage 15B can be opened or closed corresponding to the temperature DT of the electronic device 11 as described in FIG. 3.

When the refrigerant temperature RT on the outlet side of the compressor 18 is higher than the upper limit temperature PT, a determination result in step S11 is YES and the control proceeds to step S13. The electromagnetic valve 15AV is opened by a control of the system controller 31 and refrigerant condensed and cooled by the condenser 19 flows into the accumulator 17 through the bypass passage 15A. As a consequence, the temperature RT of refrigerant supplied from the accumulator 17 to the compressor 18 drops thereby preventing the compressor 18 from being overheated.

Drop of the refrigerant temperature RT on the outlet side of the compressor 18 by opening of the electromagnetic valve 15AV is continued while the result is NO in step S14 (RT<PT?).

If the result is YES in step S14 (RT<PT?), the control proceeds to step S12, in which the electromagnetic valve 15AV is closed under a control of the system controller 31 so that bypass refrigerant flowing into the accumulator 17 is vanished. As a consequence, the refrigerant temperature RT on the outlet side of the compressor 18 begins to rise again. Control of the refrigerant temperature on the outlet side of the compressor 18 by opening/closing of the electromagnetic valve 15AV can be carried out without affecting the temperature control operation of the electronic device 11 so much.

According to this embodiment, as described above, this temperature does not exceed the setting maximum temperature of the compressor 18 even if the quantity of heat generated from the heater 14$b$ increases in a high temperature test so that the temperature of refrigerant supplied to the compressor 18 rises. Thus, components in the compressor 18 are protected from a large thermal stress, thereby protecting the compressor 18 from a damage. Thus, it is possible to maintain effectively the temperature of the electronic device 11 under test at the objective test temperature, even if the test temperature is set at a high temperature or at a low temperature.

Therefore, the quantity of heat generated from the heater 14b does not need to be carried out strictly, cost of the entire temperature control apparatus can be suppressed to a low level, a temperature controllable range between the lower limit and upper limit of the temperature control can be secured widely and an electronic device which can be tested is not restricted to any particular type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A temperature control apparatus comprising:
    a temperature control head kept in contact with an electronic device as a testing object thermally;
    an electric heater attached to the temperature control head;
    a refrigerant passage formed within the temperature control head so as to run through refrigerant inside thereof;
    a first temperature sensor which detects a temperature of the electronic device;
    a compressor which compresses refrigerant coming out of the temperature control head;
    a second temperature sensor which detects a temperature of refrigerant on the outlet side of the compressor;
    a condenser which condenses refrigerant coming out of the compressor;
    a returning portion which returns refrigerant condensed by the condenser to the temperature control head;
    a bypass portion including first and second bypass passages connected in parallel to each other for returning the refrigerant condensed by the condenser to the compressor by bypassing the temperature control head;
    a first control portion which controls the temperature of the electronic device by controlling a quantity of electricity of the electric heater, a quantity of refrigerant flowing through the first bypass passage and a quantity of refrigerant flowing through the refrigerant passage in the temperature control head corresponding to an output of the first temperature sensor; and
    a second control portion which controls the temperature of the refrigerant on the intake side of the compressor by controlling a quantity of refrigerant flowing through the second bypass passage corresponding to the output of the second temperature sensor.

2. The temperature control apparatus according to claim 1, wherein the second control portion includes means for bypassing the refrigerant to the second bypass passage when an output temperature value of the second temperature sensor exceeds an upper limit value of the temperature of refrigerant on the outlet side of the compressor set preliminarily as a result of comparison of an output temperature value of the second temperature sensor with the upper limit value of the refrigerant temperature.

3. The temperature control apparatus according to claim 2, wherein the means for bypassing includes an electromagnetic valve provided on the second bypass passage and means for turning ON/OFF the refrigerant flowing through the second bypass passage by means of the electromagnetic valve.

4. The temperature control apparatus according to claim 1, wherein at least one of the first and second control portions includes a controller for PID control.

5. The temperature control apparatus according to claim 1, further comprising a bypass line for supplying the refrigerant at the outlet side of the compressor to the temperature control head by bypassing the condenser.

6. The temperature control apparatus according to claim 5, wherein the bypass line includes a control valve for controlling flow rate of the refrigerant from the compressor.

* * * * *